(12) United States Patent
Koshimizu et al.

(10) Patent No.: US 8,425,791 B2
(45) Date of Patent: Apr. 23, 2013

(54) IN-CHAMBER MEMBER TEMPERATURE CONTROL METHOD, IN-CHAMBER MEMBER, SUBSTRATE MOUNTING TABLE AND PLASMA PROCESSING APPARATUS INCLUDING SAME

(75) Inventors: Chishio Koshimizu, Nirasaki (JP); Manabu Iwata, Nirasaki (JP); Tatsuo Matsudo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 739 days.

(21) Appl. No.: 12/498,703

(22) Filed: Jul. 7, 2009

(65) Prior Publication Data
US 2010/0000970 A1 Jan. 7, 2010

Related U.S. Application Data

(60) Provisional application No. 61/107,018, filed on Oct. 21, 2008.

(30) Foreign Application Priority Data

Jul. 7, 2008 (JP) ................. 2008-177412

(51) Int. Cl.
*G01L 21/30* (2006.01)
*G01R 31/00* (2006.01)
(52) U.S. Cl.
USPC .............................................. 216/61; 216/71
(58) Field of Classification Search .......... 216/61, 216/71, 69, 67; 156/345.52
See application file for complete search history.

(56) References Cited

U.S. PATENT DOCUMENTS

| | | | |
|---|---|---|---|
| 5,187,115 A | 2/1993 | Coleman | |
| 5,290,381 A | 3/1994 | Nozawa et al. | |
| 5,310,453 A | 5/1994 | Fukasawa et al. | |
| 5,336,326 A | 8/1994 | Karner et al. | |
| 6,648,976 B1 | 11/2003 | Matsuda et al. | |
| 2008/0309239 A1* | 12/2008 | Kasai et al. | 315/39.51 |

FOREIGN PATENT DOCUMENTS

| | | |
|---|---|---|
| DE | 40 29 268 A 1 | 3/1992 |
| JP | 7-310187 | 11/1995 |
| JP | 2001-274142 | 10/2001 |
| JP | 2003-7687 | 1/2003 |

(Continued)

OTHER PUBLICATIONS

Office Action issued Jul. 21, 2011 in German Application No. 10 2009 027 476.6 (With English Translation).

(Continued)

*Primary Examiner* — Roberts Culbert
(74) *Attorney, Agent, or Firm* — Rothwell, Figg, Ernst & Manbeck, P.C.

(57) ABSTRACT

In a method of controlling the temperature of an in-chamber member used in a plasma processing apparatus that processes a target substrate with plasma, a plurality of power-feeding portions is provided in the in-chamber member and the in-chamber member is heated by supplying electric power thereto through the power-feeding portions. A resistance value or resistivity of the in-chamber member is measured and the electric power is controlled based on the temperature of the in-chamber member estimated from the resistance value or resistivity. The in-chamber member includes one or more annular members arranged around the target substrate. The in-chamber member is a member making contact with plasma within a chamber and existing near the target substrate.

4 Claims, 9 Drawing Sheets

FOREIGN PATENT DOCUMENTS

| | | |
|---|---|---|
| JP | 2003-86519 A | 3/2003 |
| JP | 2004-505446 | 2/2004 |
| JP | 2005-85657 A | 3/2005 |
| JP | 2005-353812 | 12/2005 |
| JP | 2007-149411 A | 6/2007 |

OTHER PUBLICATIONS

Office Action issued May 14, 2012, in Japanese Patent Application No. 2008-177412.

* cited by examiner

FIG.7B1
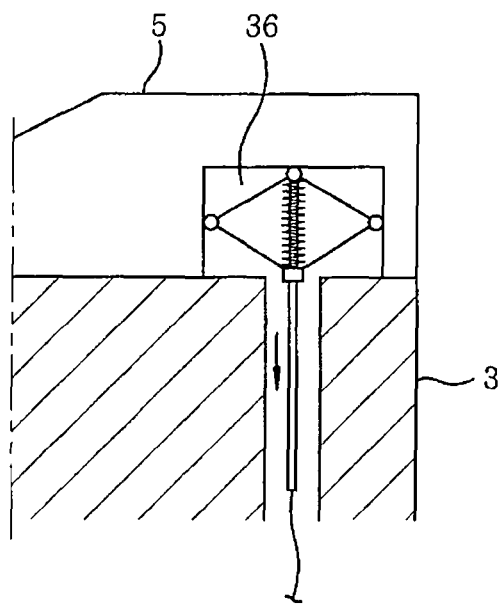
FIG.7B2
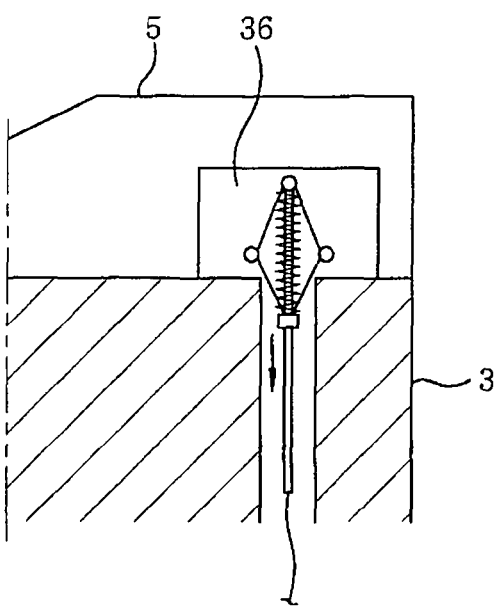

IN-CHAMBER MEMBER TEMPERATURE CONTROL METHOD, IN-CHAMBER MEMBER, SUBSTRATE MOUNTING TABLE AND PLASMA PROCESSING APPARATUS INCLUDING SAME

FIELD OF THE INVENTION

The present invention relates to a method for controlling the temperature of a member arranged within a chamber of a plasma processing apparatus for use in etching or otherwise processing a target substrate and, more specifically, to a temperature control method for optimally controlling the temperature of a focus ring, a cover ring thereof or the like arranged within a chamber in order to perform stable plasma processing from the initial stage of plasma processing.

BACKGROUND OF THE INVENTION

In a plasma processing apparatus, it is typical that a parallel plate type electrode arranged above a target substrate is provided with a plurality of gas injecting holes. An etching gas is injected through the gas injecting holes toward the whole target substrate and is converted into plasma, thereby simultaneously etching the entire surface of the target substrate.

FIG. 10 is a view schematically showing a conventional plasma processing apparatus. The plasma processing apparatus includes a vacuum chamber 1 in which an upper electrode 22 having gas injecting holes and a lower electrode 2 serving as a substrate mounting table are placed one above the other. A focus ring 5 made of, e.g., silicon, is provided in such a fashion as to surround a target substrate, i.e., a semiconductor wafer (hereinafter referred to as a wafer) 15 mounted on the lower electrode 2.

The wafer 15 is electrostatically attracted by an electrostatic chuck 16. Within the electrostatic chuck 16, there is installed a flat internal electrode 17 to which a chuck voltage is fed from a power supply (not shown). A processing gas selected depending on the kind of processing is injected through the gas injecting holes of the upper electrode 21 toward the wafer 15. A vacuum pump (not shown) performs vacuum evacuation and maintains the pressure inside the chamber 1 at a predetermined level. If a high frequency voltage is applied from a high frequency power supply 12 between the upper electrode 22 and the lower electrode 2, the processing gas is converted into plasma whereby the wafer 15 as a target substrate is subjected to specified processing, e.g., etching.

In the etching process, shapes such as trenches or holes are formed on the wafer in the vertical direction. For the vertical shape formation, a bias voltage is usually supplied to the wafer by applying high frequency voltage in a relatively low frequency thereto. Electric fields perpendicular to the wafer surface are generated by the bias voltage. The vertical shape formation can be performed by the behavior of ions accelerated by the electric fields. Since the electric fields are distorted in an edge portion of the wafer, however, there is posed a problem that the bias voltage is not normally applied, causing shapes to be inclined.

As a result, it is sometimes the case that the devices obtained from a peripheral portion of the wafer 15 have low production yield. The low production yield due to non-uniform etching becomes significant as the diameter of the wafer 15 increases.

In order to cope with such a problem, the focus ring 5 of annular shape is arranged around the wafer 15 placed on the lower electrode 2 serving as a substrate mounting table. Thus the diameter of the wafer 15 in appearance is increased by the focus ring 5. Consequently, the peripheral portion of the wafer 15 is expanded to the peripheral portion of the focus ring 5, and the peripheral portion of the focus ring 5 can be regarded as the peripheral portion of the wafer 15. This assists in making uniform the in-plane etching rate of the wafer 15.

Inasmuch as ions impinge against the focus ring 5 during the plasma processing, the focus ring 5 is heated to an elevated temperature. In case where a plurality of workpieces is continuously processed by plasma, the temperature of the focus ring 5 begins to increase as the first workpiece is subjected to plasma processing. After an arbitrary number of workpieces have been processed, the temperature of the focus ring 5 is stabilized at a constant value, thus coming into a steady state. In other words, the temperature of the focus ring 5 is changed from the outset of processing and then stabilized. Such a change in temperature affects the density of radicals present around the wafer 15, thus causing non-uniform of etching in the peripheral edge portion of the wafer 15.

In order to optimize the state of radical-containing plasma within the chamber, it is very important that the temperature of the members used in the chamber, e.g., the temperature of the focus ring, is optimally controlled depending on the kind of processing in the course of plasma processing.

In view of the above, an attempt is made in Japanese Patent Laid-open Publication No. 2005-353812 (JP2005-353812A) to optimize the plasma state by controlling the temperature of a focus ring to become 50° C. or more greater than the temperature of a wafer when the wafer mounted on a mounting table is processed by plasma. As set forth in JP2005-353812A, however, it is not easy to bury heaters in all of the members used in plasma processing. Furthermore, the focus ring is worn out by the physical impact of plasma or the chemical reaction, which leads to increased cost.

In Japanese Patent Laid-open Publication No. 7-310187 (JP7-310187A), the pressure of a gas filled between a protector plate, i.e., a focus ring, and a mounting table is made adjustable and the temperature of the protector plate is controlled so as to stabilize the plasma processing state. The protector plate is coated with a heating element (or a heater) so that the temperature of the protector plate can be uniformly increased by ion collision. As mentioned in JP7-310187A, however, the protector plate coated with the heating element requires a specified time until the temperature thereof is increased up to a stable state by plasma impact.

In Japanese Patent Laid-open Publication No. 2001-274142 (JP2001-274142A), a silicon ring as a focus ring is provided with a current-feeding portion and is self-heated as an electric current is supplied thereto through the current-feeding portion. The temperature of the silicon ring is controlled by the self-heating. As stated in JP2001-274142A, however, a heater pattern needs to be formed in the silicon ring in order that the silicon ring can be uniformly heated by the self-heating. It is not easy to form the heater pattern. In addition, the technique disclosed in JP2001-274142A poses a problem in that it is impossible to detect the temperature of the self-heating silicon ring and to optimally control the temperature of the silicon ring depending on the condition of plasma processing.

SUMMARY OF THE INVENTION

In view of the above, the present invention provides a method capable of optimally controlling the temperature of different members used in plasma processing from the beginning of plasma processing.

The present invention also provides a plasma processing apparatus capable of plasma-processing a target substrate with increased in-plane uniformity and enhanced stability.

In accordance with a first aspect of the invention, there is provided an in-chamber member temperature control method for controlling the temperature of an in-chamber member used in a plasma processing apparatus that processes a target substrate with plasma, including: providing a plurality of power-feeding portions in the in-chamber member; heating the in-chamber member by supplying electric power thereto through the power-feeding portions; measuring a resistance value or resistivity of the in-chamber member; and controlling the electric power based on the temperature of the in-chamber member estimated from the resistance value or resistivity.

Preferably, the in-chamber member includes one or more annular members arranged around the target substrate.

Preferably, the in-chamber member includes a member making contact with plasma within a chamber and existing near the target substrate.

Preferably, the annular member is of a C-shape with the power-feeding portions provided at its opposite ends or is divided into two bodies, each of which has the power-feeding portions at its opposite ends.

Preferably, an electric current is controlled so as to uniformly flow through the in-chamber member and to heat the in-chamber member with increased in-plane temperature uniformity by feeding the electric power through one set of the power-feeding portions, feeding the electric power through another set of the power-feeding portions and repeating the power feeding steps.

In accordance with a second aspect of the invention, there is provided an in-chamber member used within a chamber of a plasma processing apparatus for turning a processing gas to plasma with radio frequency power within the chamber and for processing a target substrate mounted on a mounting table with the plasma, including: a plurality of power-feeding portions, each of which has a terminal pressed against or fitted to the in-chamber member by a pressing mechanism or a fitting mechanism.

Preferably, the in-chamber member includes one or more annular members arranged around the target substrate.

Preferably, the in-chamber member includes a member making contact with the plasma within the chamber and existing near the target substrate.

Preferably, the annular member is of a C-shape with the power-feeding portions provided at its opposite ends or is divided into two bodies, each of which has the power-feeding portions at its opposite ends.

Preferably, a substrate mounting table arranged within a chamber in which a target substrate is subjected to plasma processing and the substrate includes the in-chamber member.

In accordance with a third aspect of the invention, there is provided a plasma processing apparatus for turning a processing gas to plasma with radio frequency power within a chamber and for processing a target substrate mounted on a mounting table with the plasma, including: an in-chamber member including a plurality of power-feeding portions used in plasma processing; a power supply unit for supplying electric power to the power-feeding portions; a resistance measuring unit for measuring the resistance value and/or resistivity of the in-chamber member; and a current control unit for controlling the electric power based on the temperature of the in-chamber member estimated from the resistance value or resistivity.

Preferably, the in-chamber member includes one or more annular members arranged around the target substrate.

Preferably, the in-chamber member includes a member making contact with the plasma within the chamber and existing near the target substrate.

Preferably, the annular member is of a C-shape with the power-feeding portions provided at its opposite ends or is divided into two bodies, each of which has the power-feeding portions at its opposite ends.

Preferably, the plasma processing apparatus further includes a control mechanism that causes an electric current to uniformly flow through the in-chamber member by feeding the electric power through one set of the power-feeding portions, feeding the electric power through another set of the power-feeding portions and repeating the power feeding steps.

In accordance with the present invention, it becomes possible to suitably and easily control the temperature of the members used in plasma processing. This makes it possible to optimize the plasma state. It is also possible to provide a plasma processing apparatus capable of plasma-processing a target substrate with increased in-plane uniformity.

BRIEF DESCRIPTION OF THE DRAWINGS

The objects and features of the present invention will become apparent from the following description of embodiments, given in conjunction with the accompanying drawings, in which:

FIGS. 7A, 7B1 and 7B2 are views showing additional exemplary structures of the current-feeding portions (electrodes) of the focus ring;

DETAILED DESCRIPTION OF THE PREFERRED EMBODIMENTS

Hereinafter, a plasma processing apparatus in accordance with an embodiment of the present invention will be described as a plasma etching apparatus in detail with reference to the accompanying drawings. However, the present invention shall not be limited thereto.

Figure 1:
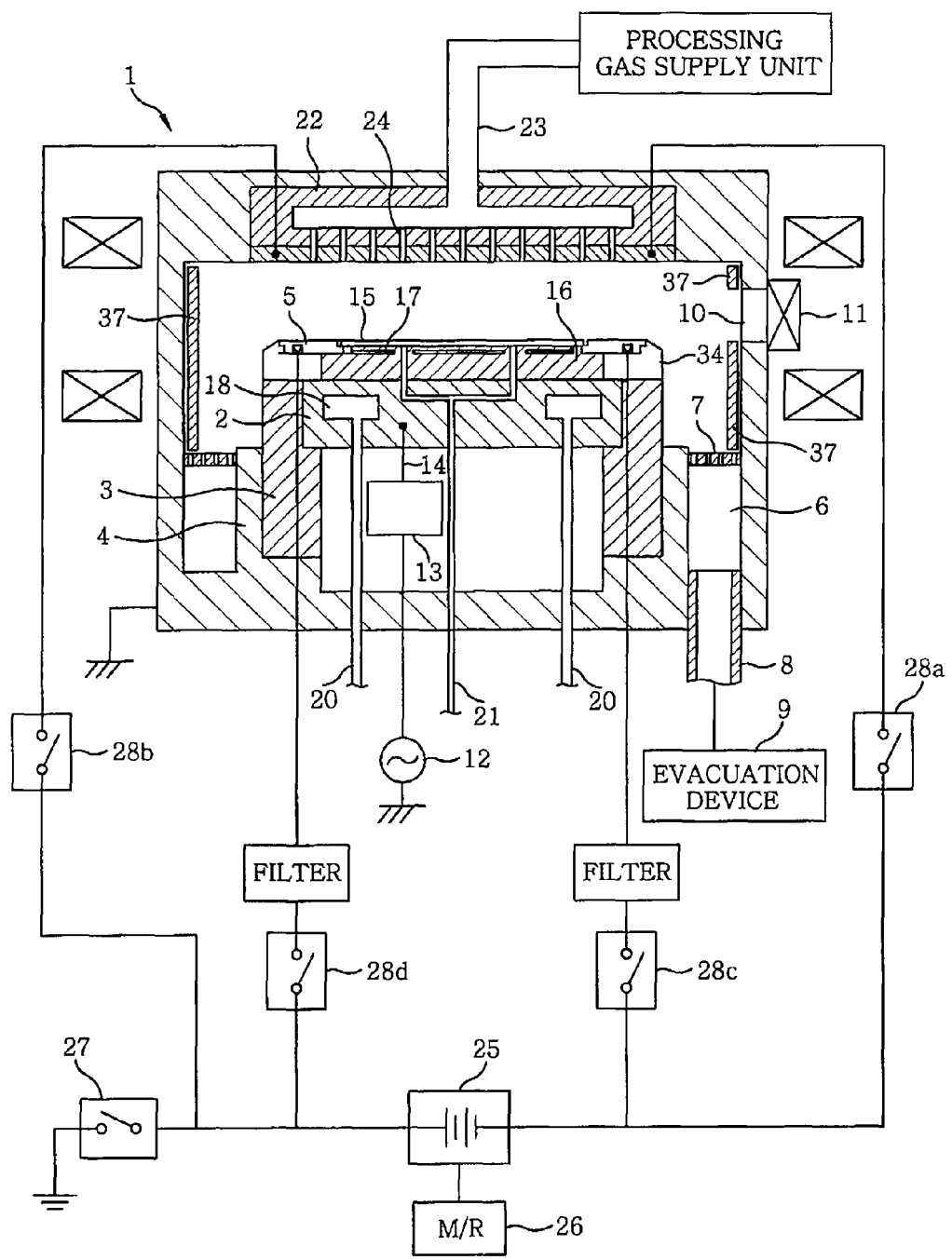
FIG. 1 is a view showing the schematic configuration of a plasma processing apparatus in accordance with one embodiment of the present invention.

FIG. 1 is a view showing the schematic configuration of a plasma processing apparatus in accordance with one embodiment of the present invention. Referring to FIG. 1, the plasma processing apparatus includes a chamber 1 made of, e.g., aluminum, stainless steel or the like. The chamber 1 has a hermetically sealable cylinder shape and remains electrically grounded.

In the chamber 1, a substrate mounting table (hereinafter referred to as a susceptor) 2 is placed to mount a target substrate, e.g., a wafer 15, thereon. The susceptor 2 shown in FIG. 1 is used as a heat exchange plate that controls the temperature of the wafer 15 by making contact with the wafer 15 and performing heat exchange therewith. The susceptor 2 is made of a material with good electric and thermal conductivity such as aluminum or the like, and serves as a lower electrode.

The susceptor 2 is held in place by a tubular holder 3 made of an insulating material such as ceramic or the like. The tubular holder 3 is supported by a tubular support portion 4 of the chamber 1. A focus ring 5 for annularly surrounding the upper surface of the susceptor 2 is arranged on the upper surface of the tubular holder 3.

An annular exhaust path 6 is formed between the side wall and the tubular support portion 4 of the chamber 1. An annular baffle plate 7 is attached to the entrance or an intermediate area in the exhaust path 6. The bottom of the exhaust path 6 is connected to an exhaust device 9 through an exhaust pipe 8. The exhaust device 9 includes a vacuum pump and serves to evacuate the inner space of the chamber 1 to a predetermined degree of vacuum. Attached to the side wall of the chamber 1 is a gate valve 11 for opening and closing a gateway 10 through which is loaded or unloaded the wafer 15.

A radio frequency power supply 12 for generating plasma is electrically connected to the susceptor 2 is a matching unit 13 and a current-feeding rod 14. The radio frequency power supply 12 supplies electric power of relatively low frequency, e.g., 13.56 MHz, to the susceptor 2 serving as a lower electrode. In addition, there are a case for applying two or three radio frequency powers to the lower electrode, a case for respectively applying radio frequency powers to the lower electrode and the upper electrode, a case for applying radio frequency waves to the lower electrode while applying radio frequency power and a direct current to the upper electrode, a case for applying only a direct current to the upper electrode, a case for equalizing or differentiating the frequency numbers of the radio frequency powers applied to the lower and upper electrodes, and other cases.

In a ceiling portion of the chamber 1, an upper electrode 22 is placed opposite to the lower electrode, i.e., the susceptor 2. The upper electrode 22 is formed into a hollow disk shape and has a plurality of gas injecting holes 24 on its lower surface. Thus the upper electrode 22 forms a shower head. An etching gas supplied from a processing gas supply unit is introduced into a cavity portion of the upper electrode 22 through a gas inlet line 23. The etching gas in the cavity portion is uniformly injected into the chamber 1 through the gas injecting holes 24.

An electrostatic chuck 16 made of a dielectric material such as ceramic or the like is installed on the upper surface of the susceptor 2 to hold the wafer 15 with an electrostatic attracting force. An internal electrode 17 made of a conductive film, e.g., a copper film or a tungsten film, is buried in the electrostatic chuck 16.

A direct current power supply (not shown) of high voltage, e.g., 2500 V or 3000 V, is electrically connected to the internal electrode 17 through a switch. If a direct current voltage is applied to the internal electrode 17, the wafer 15 is attracted to and held by the electrostatic chuck 16 under the action of a Coulomb force or a Johnson-Rahbek force.

A heat medium (or fluid) flow path 18 is provided within the susceptor 2. A heat medium, e.g., hot water or cold water, of predetermined temperature is supplied from a temperature control unit (not shown) to the heat medium flow path 18 through a pipeline 20.

A heat transfer gas, e.g., He gas, is supplied from a heat transfer gas supply unit (not shown) to between the electrostatic chuck 16 and the back surface of the wafer 15 through a gas supply pipe 21. The heat transfer gas assures accelerated heat transfer between the electrostatic chuck 16, i.e., the susceptor 2, and the wafer 15.

With the plasma processing apparatus of the present invention shown in FIG. 1, the focus ring 5 and the upper electrode 22 are provided with current-feeding portions connected to a power supply unit 25 through switches 27 and 28a. The power supply unit 25 supplies an electric current to the focus ring 5 and the upper electrode 22 in order to heat them. Although the power supply unit 25 is a direct current supply unit in the present embodiment, it may be possible to use an alternating current supply unit or a radio frequency power supply unit. Preferably, the power supply unit 25 is of the type capable of controlling the electric power in a constant level.

In the configuration of the plasma processing apparatus shown in FIG. 1, the focus ring 5 and the upper electrode 22 are connected to the power supply unit 25. In addition, a current-feeding portion may be provided in a cover ring 34 that surrounds the outer periphery of the focus ring 5. The current-feeding portion may be connected to the power supply unit 25 through a switch. This makes it possible to more accurately control the plasma state in the peripheral edge portion of the wafer 15.

Examples of the material of the members such as the focus ring 5 and the like, used in plasma processing include a semiconductor such as silicon (Si), silicon carbide (SiC) or the like and a conductor such as aluminum, copper, metal oxide or the like. The members made of a semiconductor or a conductor is preferably heated by a direct or alternating power supply. Radio frequency waves or microwaves may be used in heating the members.

A resistance measuring unit 26 is connected to the power supply unit 25. Although the details will be described later, the resistance value or resistivity of the focus ring 5 made of, e.g., silicon, is changed as an electric current is supplied from the power supply unit 25 to the focus ring 5 to heat the focus ring 5. If the relationship between the temperature and the resistance value or resistivity of a heated member is found out in advance, it becomes possible to estimate the temperature of the heated member from the resistance value or resistivity as measured. The temperature of the heated member can be accurately controlled by controlling the electric current fed to the heated member, based on the difference between the desired temperature and the estimated temperature of the heated member.

The heated member may be a member that makes contact with plasma within the chamber 1 and that exists near the target substrate. Examples of the heated member include the upper electrode 22, the focus ring 5, the protector member 37 and the baffle plate 7.

Referring to FIG. 1, if the switches 28a and 28b are opened with the switches 28c and 28d closed, an electric current is fed to the focus ring 5, which makes it possible to heat the focus ring 5. If the switches 28a and 28b are closed with the switches 28c and 28d opened, an electric current is supplied to the upper electrode 22, which makes it possible to heat the upper electrode 22. The focus ring 5 and the upper electrode 22 can be simultaneously heated by closing all of the switches 28a, 28b, 28c and 28d. The switch 28a may be closed and the switch 28b may be opened in order to apply a negative voltage to the upper electrode 22.

Figure 2:
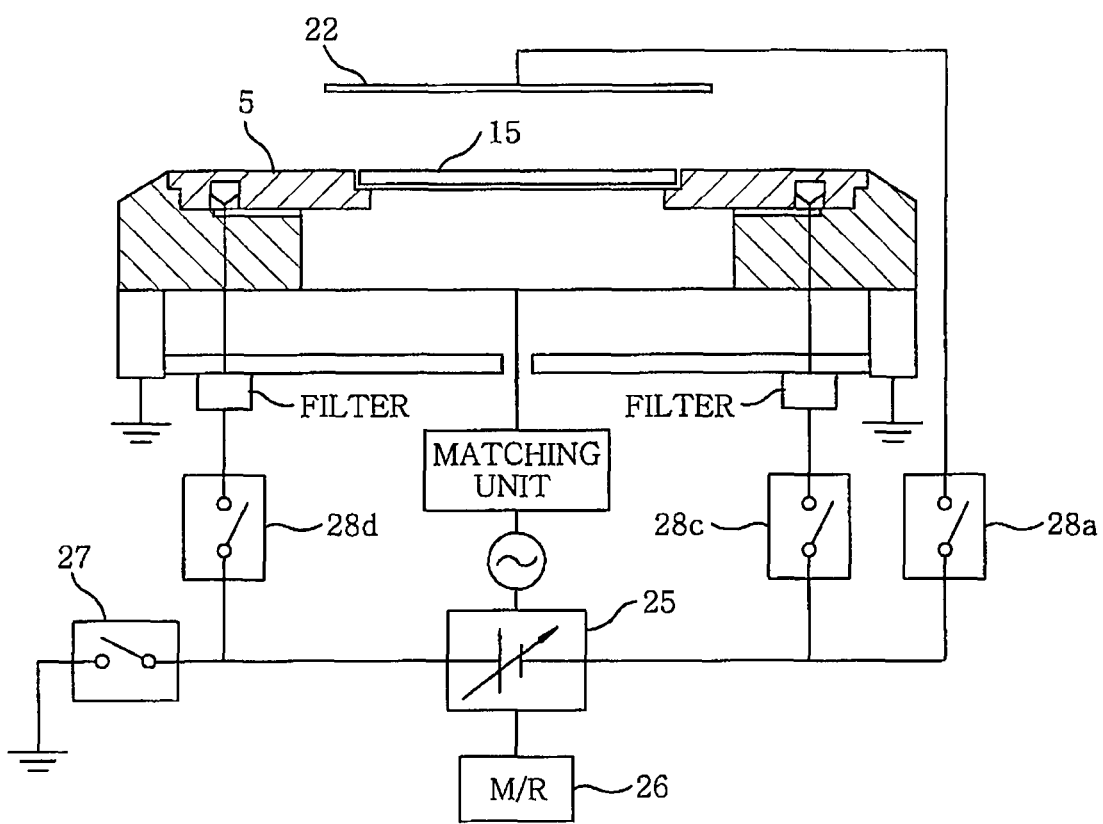
FIG. 2 is a view showing the schematic configuration of an electric circuit for feeding an electric current to a focus ring and an upper electrode.

FIG. 2 is a schematic configuration view showing an electric circuit for feeding an electric current to the focus ring 5 and an upper electrode 22. If the switches 27 and 28a are closed, a negative voltage is applied to the upper electrode 22, and radio frequency waves and a direct current are cumulatively applied to the upper electrode 22, thereby generating plasma. The electrons emitted from the upper electrode 22 come into the plasma between the electrodes and flows toward the grounded wall of the chamber 1, thus forming a direct current circuit.

In order to heat the focus ring 5, the switches 27 and 28a may be opened with the switches 28c and 28d closed. As for the timing of feeding an electric current to the focus ring 5, the electric current is fed before the plasma processing and interrupted during the plasma processing. Alternatively, the current feeding may be started before the plasma processing and continuously performed during the plasma processing. As a further alternative, the current feeding may be started before the plasma processing and continuously performed during the plasma processing and during the wafer transportation after the plasma processing.

FIGS. 3A, 3B, 3C and 3D are views illustrating different examples of the focus ring used in the present invention. Since the focus ring has a generally disk-like shape, it is possible to uniformly feed an electric current through the focus ring to some extent by arranging one current-feeding portion in a first suitable position and another current-feeding portion in a second position spaced apart 180 degrees from the first position. In an instance where the temperature of the left portion of the focus ring made of a semiconductor material such as silicon or the like grows higher than the temperature of the right portion for certain reasons, the resistance value of the right portion is increased until the temperature reaches an arbitrary value. For that reason, an electric current can flow more easily in the left portion than in the right portion. As a result, the temperature of the left portion is further increased, thereby impairing the in-plane temperature uniformity of the wafer.

Figure 3A:
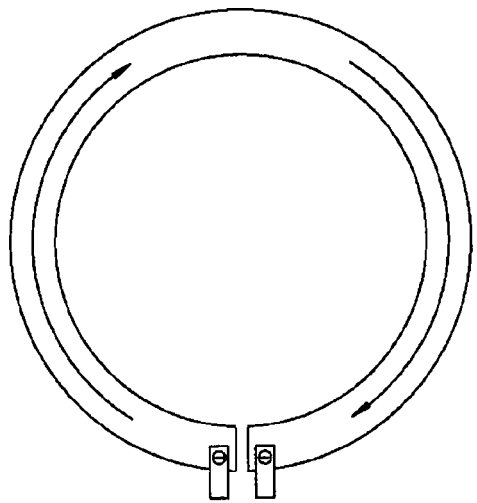
FIGS. 3A, 3B, 3C and 3D are views illustrating different examples of the focus ring used in the present invention.
Figure 3B:
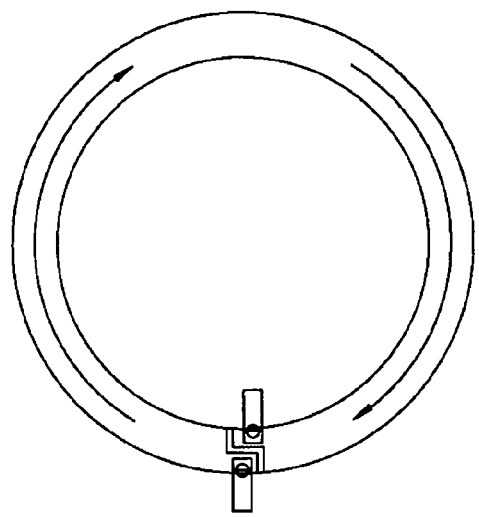
Figure 3C:
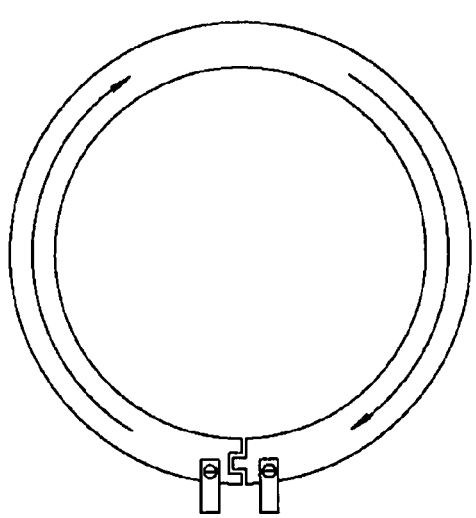
Figure 3D:
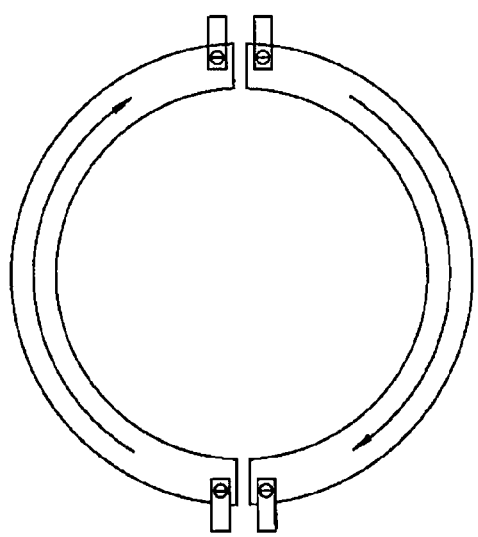

The shapes of the focus ring shown in FIGS. 3A through 3D are presented as a solution to the problem noted just above. FIGS. 3A through 3C are views showing the shapes of the focus ring whose one portion is severed to form the focus ring into an open loop shape. Current-feeding portions (electrodes) are provided in the severed opposite ends to ensure that an electric current can flow throughout the focus ring in a reliable manner and the focus ring can be heated to a uniform temperature. The focus rings shown in FIGS. 3A through 3C differ only in electrode structure from one another. The focus ring shown in FIG. 3A has parallel severed surfaces. The focus ring shown in FIG. 3B has step-like severed surfaces that engage with each other. The focus ring shown in FIG. 3C has current-feeding portions of blind electrode shape. As compared to the structure shown in FIG. 3A, use of the structures shown in FIGS. 3B and 3C makes it possible to uniformly feed an electric current through the focus ring and to heat the focus ring with increased in-plane temperature uniformity. The focus ring shown in FIG. 3D is divided into two pieces, at the opposite ends of which electrodes are provided. The number of pieces thus divided is not limited to two but may be three or more.

Figure 4A:
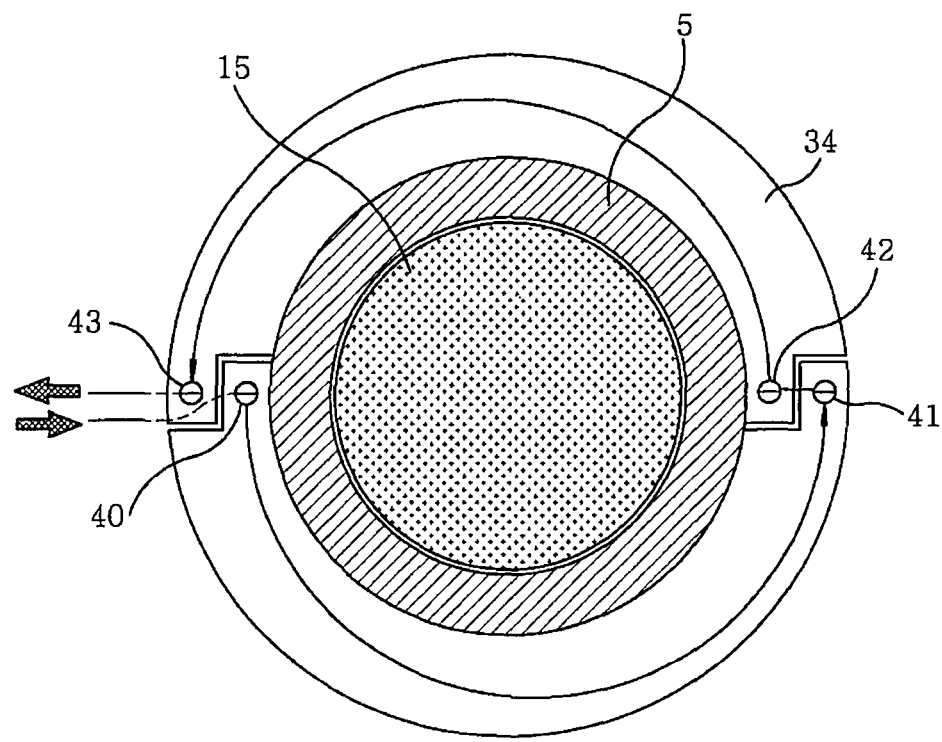
FIGS. 4A and 4B are views showing a split-type cover ring which is divided into two bodies.
Figure 4B:
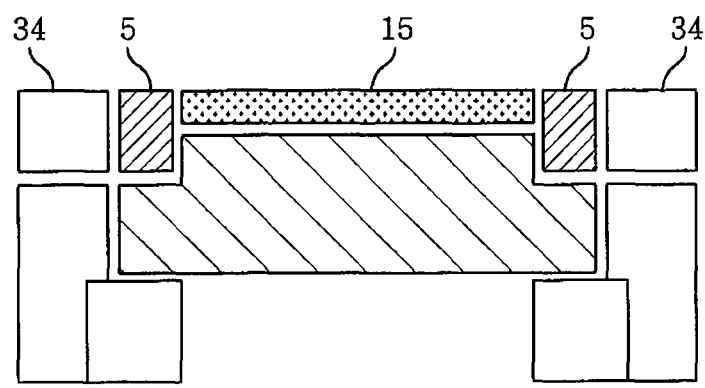

FIGS. 4A and 4B are views showing a split-type cover ring 34 of the focus ring 5, which is divided into two bodies. Referring to FIGS. 4A and 4B, the electric current supplied to an electrode 40 flows toward an electrode 41 arranged at the right side. In this regard, the electrode 41 is electrically connected to an electrode 42. Thus the electric current flows from the electrode 42 toward an electrode 43. As a result, the electric current uniformly flows through the cover ring 34, which makes it possible to heat the cover ring 34 with increased in-plane temperature uniformity. Although the cover ring 34 shown in FIGS. 4A and 4B is divided into two bodies, it may be possible to employ a cover ring divided into three or more bodies.

Figure 5:
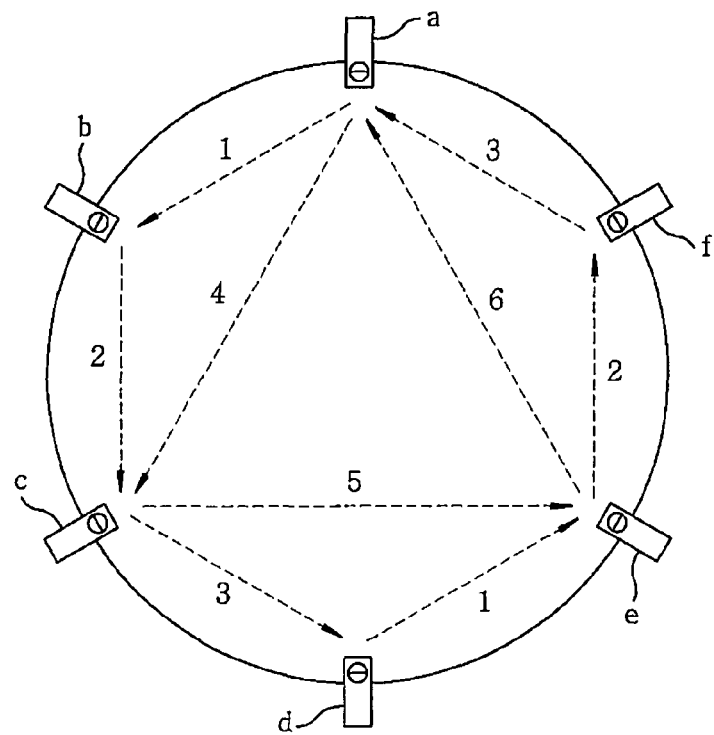
FIG. 5 is a view showing one example of the upper electrode provided with a plurality of current-feeding portions (electrodes)

FIG. 5 is a view showing one example of the upper electrode for use in a parallel plate type plasma processing apparatus, which is provided with a plurality of current-feeding portions (electrodes) through which to feed an electric current to heat the upper electrode. Since the upper electrode is arranged near the wafer, the temperature thereof heavily affects an etching process. In case of the etching process, for example, the temperature of the upper electrode is increased by the collision of ions present in the plasma immediately after starting the etching process. A specified time is required until the temperature of the upper electrode becomes stable. The temperature increase has an influence on wafers processed just after starting the etching process, rendering the quality thereof unacceptable. For that reason, a dummy wafer has been conventionally used to stabilize the environment within the chamber. However, use of the dummy wafer leads to reduced throughput and increased production cost. If the current-feeding portions are provided in the upper electrode as shown in FIG. 5 and if the upper electrode is heated by causing an electric current to flow from the current-feeding portions to the upper electrode, it becomes possible to stabilize the temperature of the upper electrode immediately after starting the etching process.

Although the upper electrode shown in FIG. 5 is of a one-piece type, it may be possible to employ a split-type upper electrode concentrically divided into a plurality of electrode pieces. In this case, it is preferred that one of the radio frequency power supply, the direct current supply and the ground level is connected to the divided electrode pieces. It is also preferred that both of the radio frequency power supply and the direct current supply are connected to the divided electrode pieces.

The upper electrode shown in FIG. 5 is provided with six electrodes. By allowing an electric current to flow as follows, it is possible to further increase the in-plane temperature uniformity of the upper electrode. More specifically, an electric current 1 is first allowed to flow between the electrodes a and b and between the electrodes e and d. Then, an electric current 2 is allowed to flow between the electrodes b and c and between the electrodes f and e. Thereafter, an electric current 3 is allowed to flow between the electrodes c and d and between the electrodes a and f. Electric currents 4, 5 and 6 are allowed to flow in a similar manner. By gradually changing the electrodes through which an electric current flows within a specified time period, it becomes possible to increase the in-plane temperature uniformity of the upper electrode.

Figure 6:
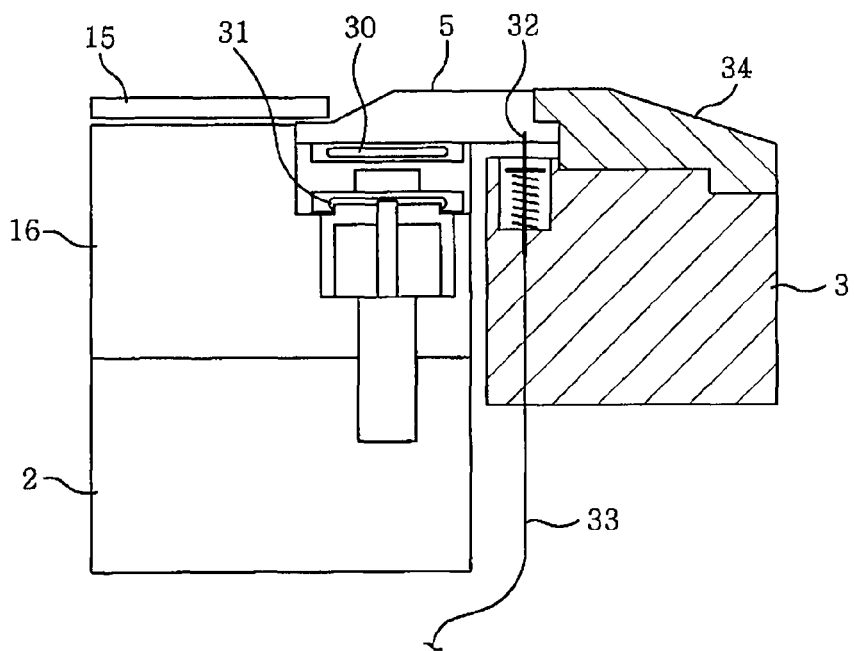
FIG. 6 is a view showing one exemplary structure of the current-feeding portions (electrodes) of the focus ring.
Figure 7A:
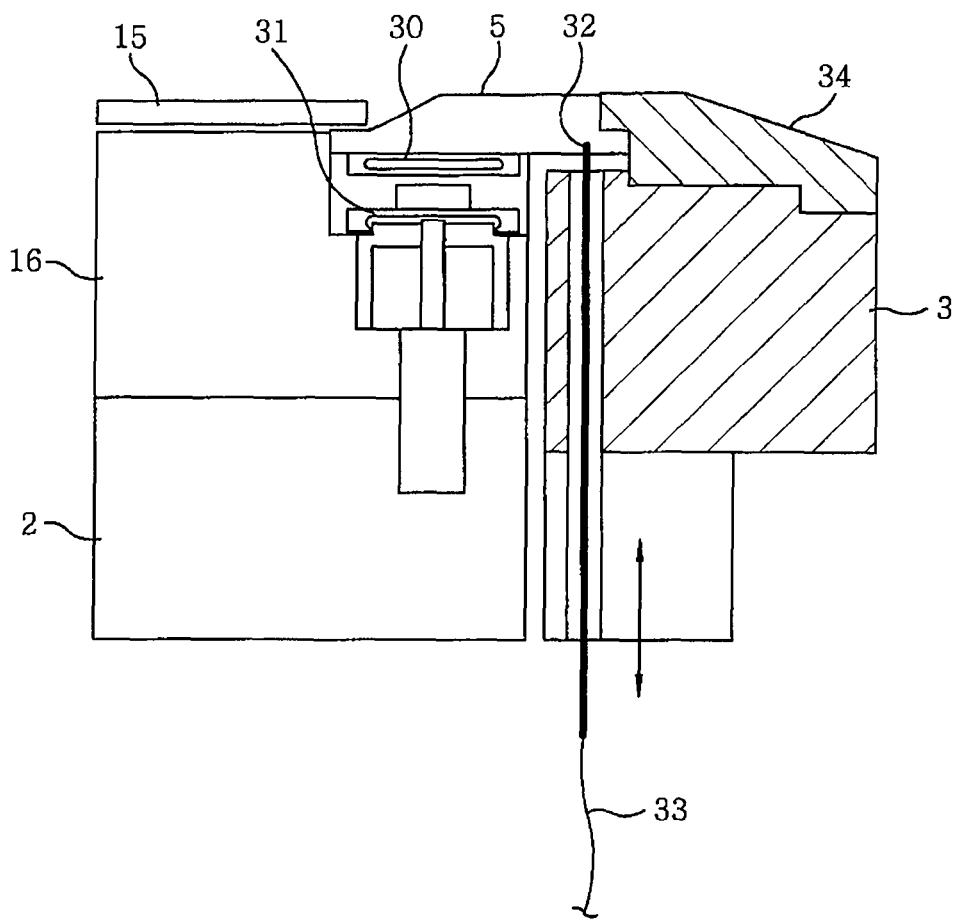

FIG. 6 is a view showing one exemplary structure of the current-feeding portions (electrodes) through which to feed an electric current to the focus ring 5. Referring to FIG. 6, the electrostatic chuck 16 and the susceptor 2 are arranged below the focus ring 5. An upper heat transfer sheet 30 and a lower heat transfer sheet 31 are provided to improve the heat conductivity of the focus ring 5.

With the structure shown in FIG. 6, a space for accommodating an electrode bar 32 and so forth is defined in the tubular holder portion 3, and the electrode bar 32 is press-fitted into the focus ring 5. Within the cavity defined in the tubular holder portion 3, the electrode bar 32 is pressed against the focus ring 5 by a spring member. Use of this structure makes it possible to sharply reduce the contact resistance between the electrode bar 32 and the focus ring 5. In this structure, there is no need to subject the focus ring 5 to any special processing, which makes it possible to reduce the production cost.

FIGS. 7A, 7B1 and 7B2 are views showing additional exemplary structures of the current-feeding portions (electrodes) of the focus ring 5. In the electrode structure shown in FIG. 7A, the electrode bar 32 is configured so that it can be inserted into and removed from the focus ring 5. In the electrode structure shown in FIGS. 7B1 and 7B2, a contact member as an electrode can be expanded within a cavity 36. This enables the electrode 32 to make strong contact with the focus ring 5 at three points, thereby reducing the contact resistance. Use of this structure makes it possible to remove the electrode bar 32, assuring the ease of maintenance of the electrode.

In addition to the electrode structures described above, it may be possible to employ an electrode structure in which a female thread is formed in the focus ring 5 and an electrode bar with a male thread is threadedly coupled to the focus ring 5 or an electrode structure in which the focus ring 5 and the electrode bar are fused together. This also makes it possible to reduce the contact resistance.

EXPERIMENT

Figure 8:
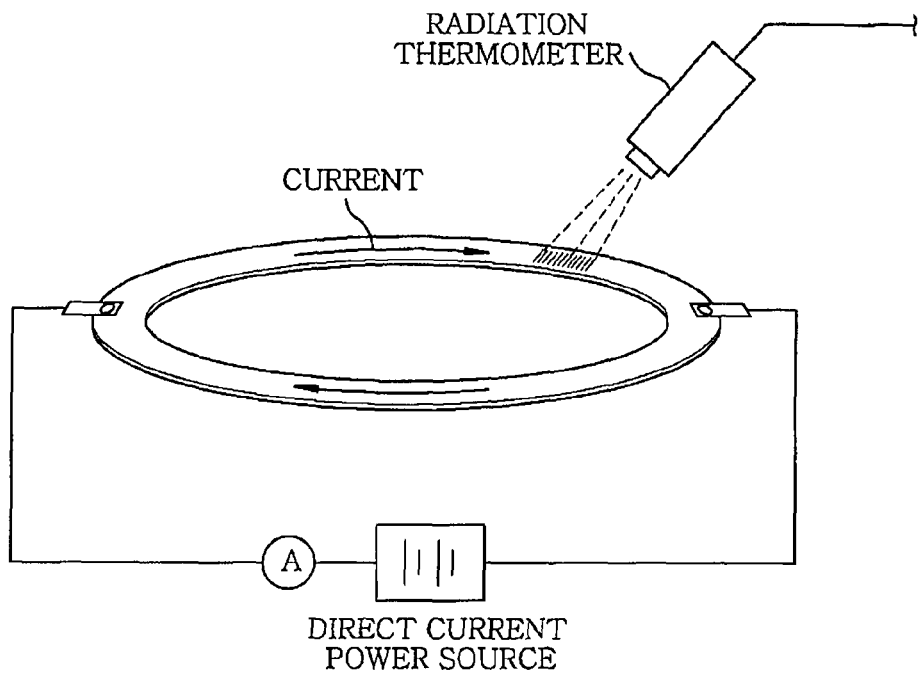
FIG. 8 is a view illustrating the circuit configuration when the focus ring is heated by a direct current power source.

FIG. 8 is a view illustrating the circuit configuration when a focus ring (of 360 mm in diameter and 3.4 mm in thickness) for a silicon wafer of 300 mm in diameter is heated by a direct current power supply.

The direct current power supply used in the experiment has the maximum rated power of 1 kW and the maximum current value of 3 A. Since the resistance value of the focus ring remains high for 30 seconds after starting the test, there was no choice but to heat the focus ring with the power of about 1 kW during that period. The focus ring was heated by controlling the power to become equal to 2 kW in total.

Figure 9:
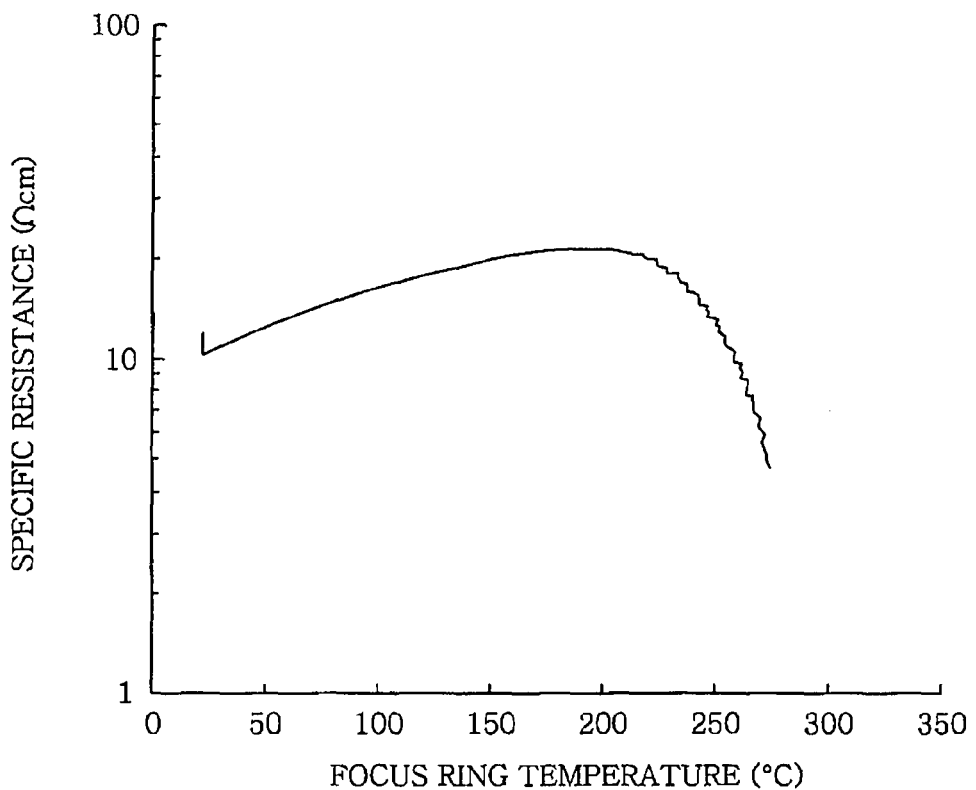
FIG. 9 is a graph plotting the resistivity in a vertical axis and the focus ring temperature in a horizontal axis.
Figure 10:
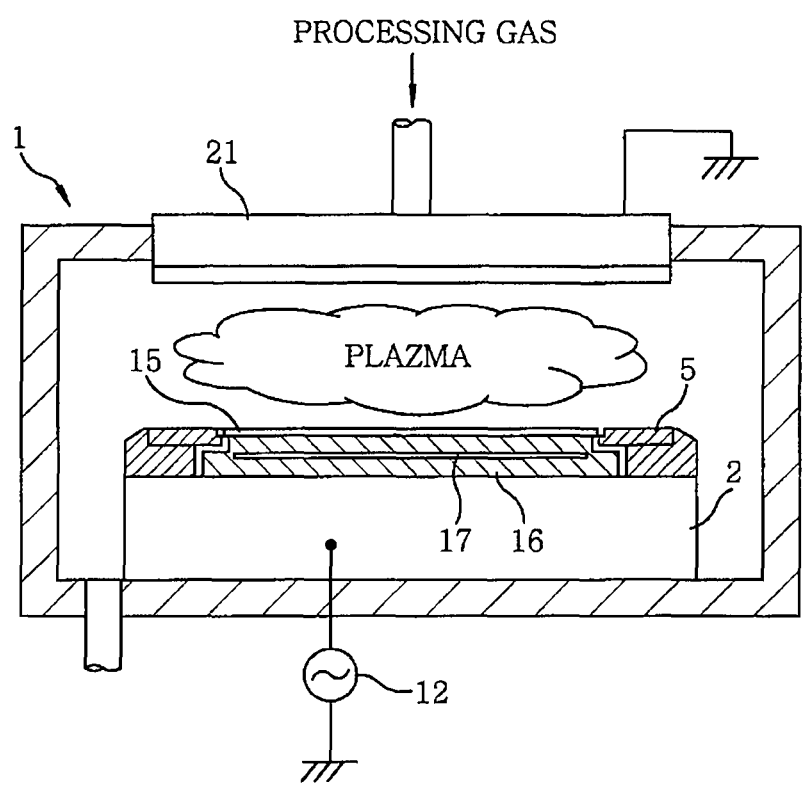
FIG. 10 is a view schematically showing a conventional plasma processing apparatus.

The temperature of the focus ring was measured by painting a portion of the focus ring in black and monitoring a sample temperature with a radiation thermometer. Shown in FIG. 9 is the resistivity of the focus ring measured in the test noted above.

The resistivity was calculated by using the value of the power supplied from the direct current power supply to the focus ring and the diameter, thickness and shape of the focus ring. As shown in FIG. 9, the resistivity of the focus ring is substantially rectilinearly increased while the temperature thereof exceeds 50° C. and reaches about 220° C. The resistivity is sharply decreased if the temperature exceeds 220° C.

If the relationship between the temperature and the resistance value or resistivity of a heated object is found out in advance, it becomes possible to estimate the temperature of the heated object from the resistance value or resistivity as measured. As illustrated in FIG. 9, two temperature values exist for one resistance value or resistivity in case where the heated object is a semiconductor. The determination on which temperature value is the currently measuring temperature can be made by, e.g., momentarily raising or lowering the heating power and observing the change in the resistivity at that time. In other words, the change in the resistivity may be used in determining which of the two temperature values, i.e., the rising-side temperature value and the falling-side temperature value, indicates the currently measuring temperature. Assuming that the resistivity is 12Ω for example, the temperature is determined to be 250° C. if the resistivity becomes lower than 12Ω when momentarily raising the heating temperature. In contrast, if the resistivity becomes greater than 12Ω, the temperature is determined to be 60° C. In case where the temperature monitoring alone is performed without having to heat the focus ring, the resistivity may be calculated by momentarily applying a low voltage or a low current.

If the focus ring is used for a long period of time, it is sometimes the case that the resistivity thereof is shifted even at the same temperature and the cross-sectional area thereof is changed by the consumption thereof. In view of this, it is preferred that nitrogen gas is filled to increase the pressure during the idling time of an apparatus and the temperature of a heated object is made equal to the temperature of the electrostatic chuck, the resistivity being calculated through the use of a current or a voltage.

While the invention has been shown and described with respect to the embodiments, it will be understood by those skilled in the art that various changes and modification may be made without departing from the scope of the invention as defined in the following claims.

What is claimed is:

1. A method of controlling the temperature of an in-chamber member for use in a plasma processing apparatus that processes a target substrate with a plasma, comprising:
    providing the in-chamber member with a plurality of power-feeding portions;
    pressing a terminal of each of the power-feeding portions against the in-chamber member by a pressing mechanism;
    heating the in-chamber member by supplying electric power thereto through the power-feeding portions;
    measuring a resistance value or a resistivity of the in-chamber member; and
    controlling the electric power based on the temperature of the in-chamber member estimated from the resistance value or the resistivity,
    wherein the in-chamber member includes one or more annular members arranged around the target substrate, and
    wherein an electric current is controlled to uniformly flow through the in-chamber member by supplying electric power thereto through the pressed terminal of each of the power-feeding portions.

2. The method of claim 1, wherein the annular member is of an open loop shape with the power-feeding portions provided at its opposite ends or is divided into two bodies which have the power-feeding portions at their opposite ends.

3. A method of controlling the temperature of an in-chamber member for use in a plasma processing apparatus that processes a target substrate with a plasma, comprising:
    providing the in-chamber member with a plurality of power-feeding portions;
    pressing a terminal of each of the power-feeding portions against the in-chamber member by a pressing mechanism;
    heating the in-chamber member by supplying electric power thereto through the power-feeding portions;
    measuring a resistance value or a resistivity of the in-chamber member; and
    controlling the electric power based on the temperature of the in-chamber member estimated from the resistance value or the resistivity,
    wherein the in-chamber member is a member making contact with the plasma within a chamber and existing near the target substrate, and
    wherein an electric current is controlled to uniformly flow through the in-chamber member by supplying electric power thereto through the pressed terminal of each of the power-feeding portions.

4. A method of controlling the temperature of an in-chamber member for use in a plasma processing apparatus that processes a target substrate with a plasma, comprising:
  providing the in-chamber member with a plurality of power-feeding portions;
  pressing a terminal of each of the power-feeding portions against the in-chamber member by a pressing mechanism;
  heating the in-chamber member by supplying electric power thereto through the power-feeding portions;
  measuring a resistance value or a resistivity of the in-chamber member; and
  controlling the electric power based on the temperature of the in-chamber member estimated from the resistance value or the resistivity,
  wherein an electric current is controlled to uniformly flow through the in-chamber member and to heat the in-chamber member with in-plane temperature uniformity by feeding electric power sequentially to selected pairs of the power-feeding portions, and repeatedly on a one pair at a time basis.

* * * * *